(12) United States Patent
Greenlee et al.

(10) Patent No.: US 12,295,140 B2
(45) Date of Patent: May 6, 2025

(54) MEMORY ARRAYS COMPRISING STRINGS OF MEMORY CELLS AND METHODS USED IN FORMING A MEMORY ARRAY COMPRISING STRINGS OF MEMORY CELLS

(71) Applicant: Micron Technology, Inc., Boise, ID (US)

(72) Inventors: Jordan D. Greenlee, Boise, ID (US); Allen McTeer, Eagle, ID (US); Rita J. Klein, Boise, ID (US); John D. Hopkins, Meridian, ID (US); Nancy M. Lomeli, Boise, ID (US); Xiao Li, Boise, ID (US); Alyssa N. Scarbrough, Boise, ID (US); Jiewei Chen, Meridian, ID (US); Naiming Liu, Meridian, ID (US); Shuangqiang Luo, Boise, ID (US); Silvia Borsari, Boise, ID (US); John Mark Meldrim, Boise, ID (US); Shen Hu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 607 days.

(21) Appl. No.: 17/533,580

(22) Filed: Nov. 23, 2021

(65) Prior Publication Data

US 2023/0164985 A1  May 25, 2023

(51) Int. Cl.
*H10B 41/27* (2023.01)
*H10B 41/35* (2023.01)
(Continued)

(52) U.S. Cl.
CPC ............. *H10B 41/27* (2023.02); *H10B 41/35* (2023.02); *H10B 43/27* (2023.02); *H10B 43/35* (2023.02)

(58) Field of Classification Search
CPC ........ H10B 41/27–42; H10B 43/27–40; H01L 21/22–228; H01L 21/38–388; H01L 21/76855–76859; H01L 21/0257–02584
See application file for complete search history.

(56) References Cited

U.S. PATENT DOCUMENTS

| | | | |
|---|---|---|---|
| 2016/0104719 A1* | 4/2016 | Jung | H10B 43/20 257/324 |
| 2020/0219898 A1* | 7/2020 | Kanamori | H10B 43/50 |

(Continued)

*Primary Examiner* — Amar Movva
*Assistant Examiner* — Eric Manuel Mulero Flores
(74) *Attorney, Agent, or Firm* — Wells St. John P.S.

(57) ABSTRACT

A memory array comprising strings of memory cells comprises laterally-spaced memory blocks individually comprising a vertical stack comprising alternating insulative tiers and conductive tiers. Strings of memory cells comprise channel-material strings that extend through the insulative tiers and the conductive tiers in the memory blocks. A through-array-via (TAV) region comprises TAV constructions that extend through the insulative tiers and the conductive tiers. The TAV constructions individually comprise a radially-outer insulative lining and a conductive core radially-inward of the insulative lining. The insulative lining comprises a radially-inner insulative material and a radially-outer insulative material that are of different compositions relative one another. The radially-outer insulative material is in radially-outer recesses that are in the first tiers as compared to the second tiers. The radially-inner insulative material extends elevationally along the insulative tiers and the conductive tiers. Other embodiments, including method, are disclosed.

14 Claims, 13 Drawing Sheets

(51) Int. Cl.
*H10B 43/27* (2023.01)
*H10B 43/35* (2023.01)

(56) References Cited

U.S. PATENT DOCUMENTS

2021/0013222 A1* 1/2021 Lee ................... H10B 63/845
2021/0167083 A1* 6/2021 Kim ................... H01L 29/0847
2021/0210505 A1* 7/2021 Choi ................... H10B 41/10

* cited by examiner

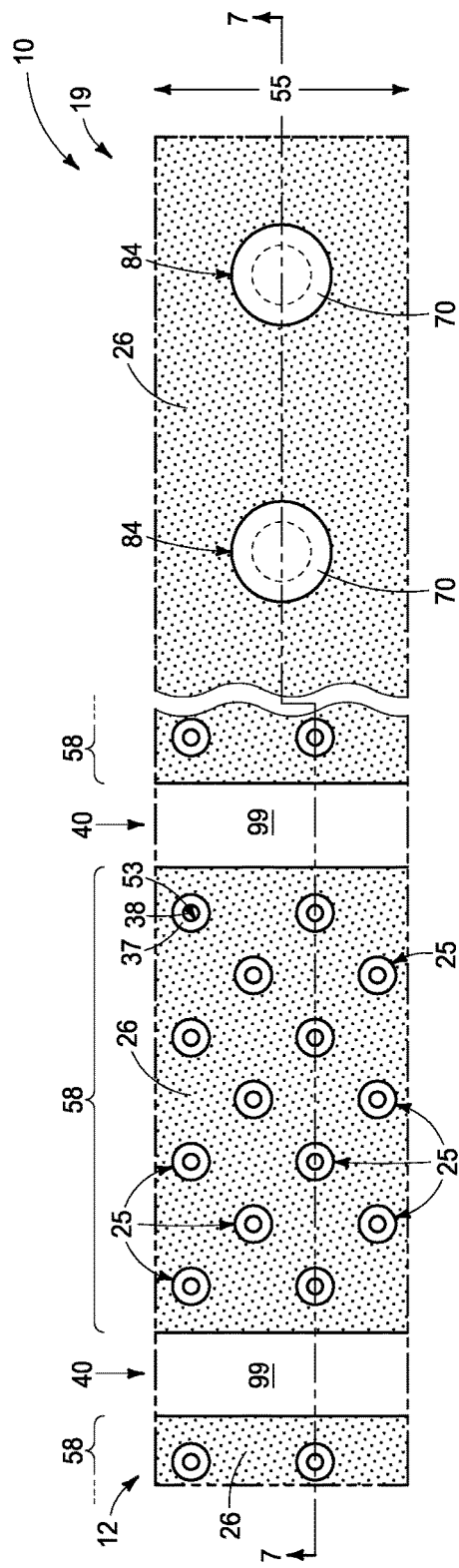
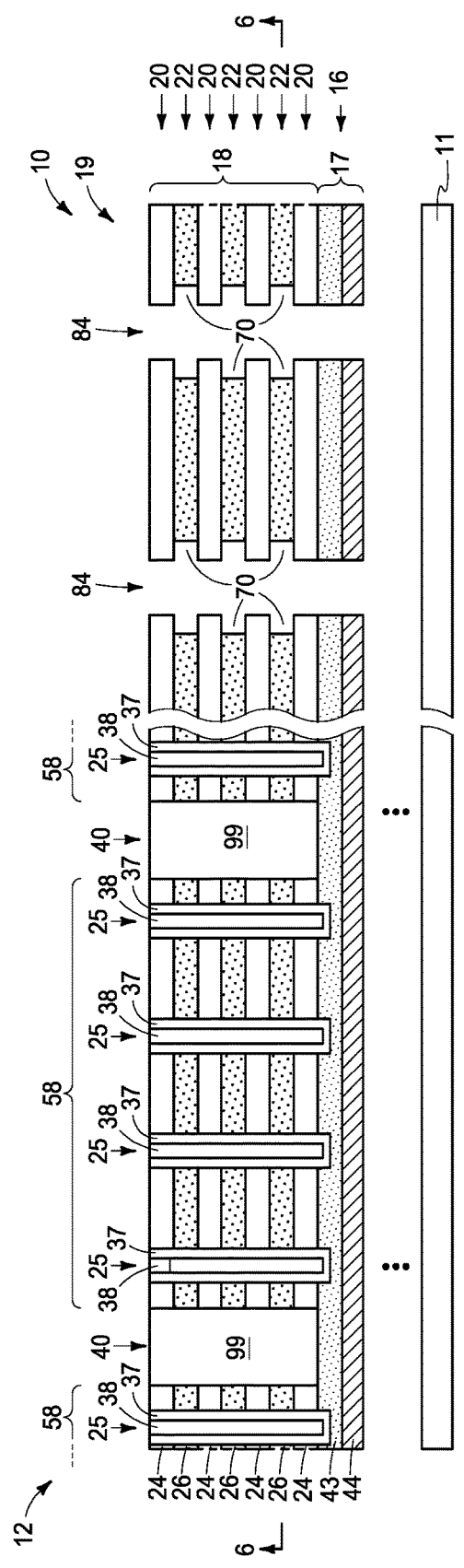

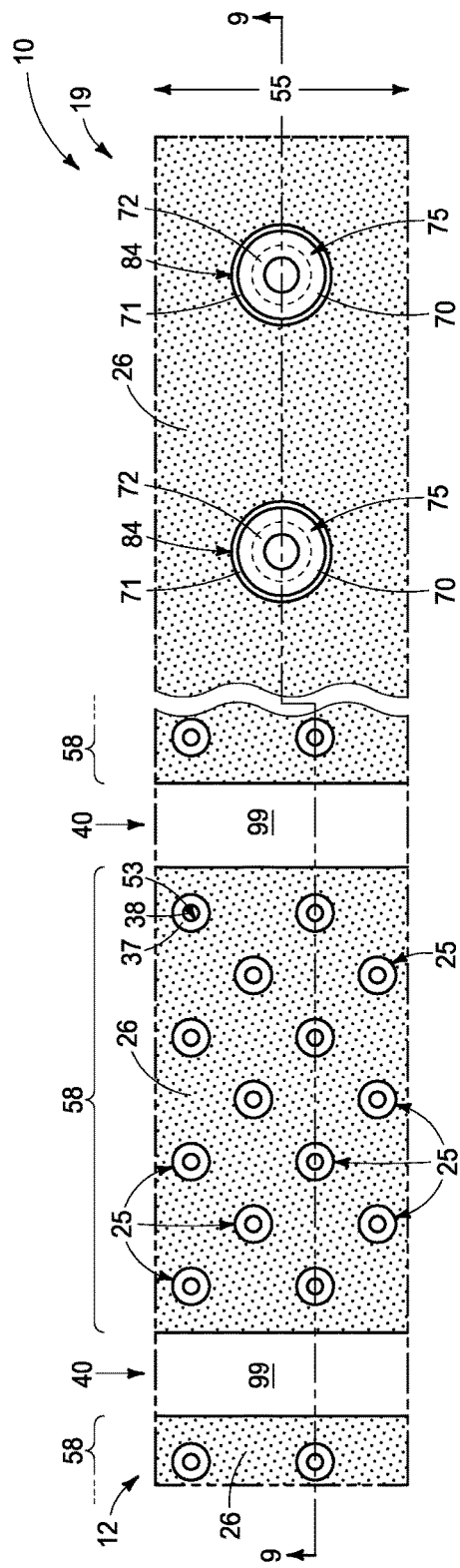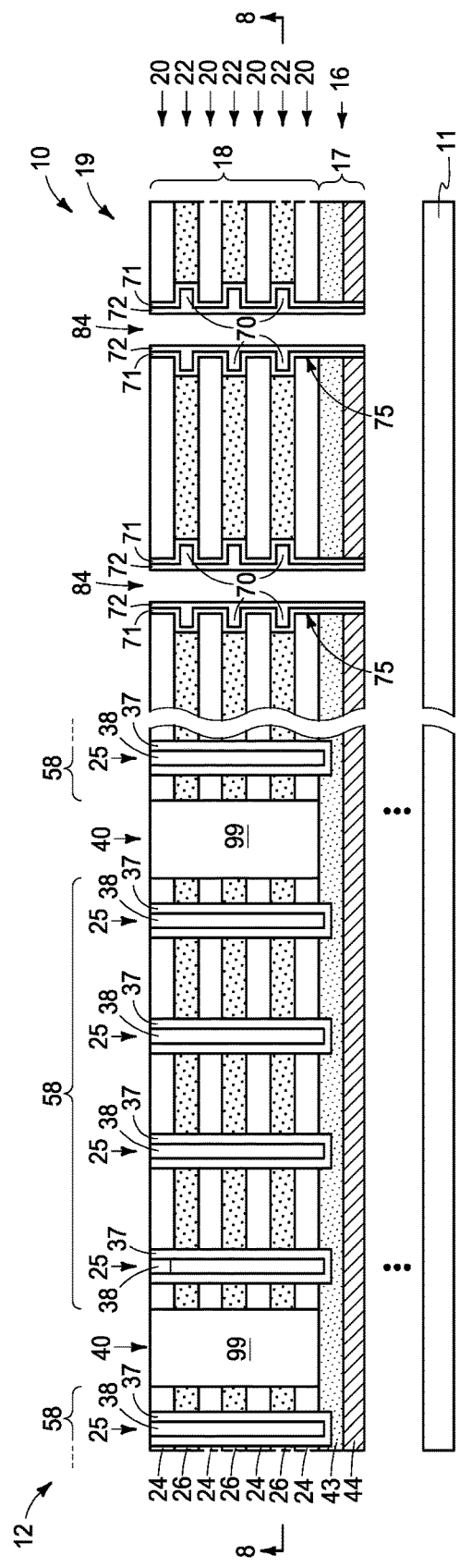

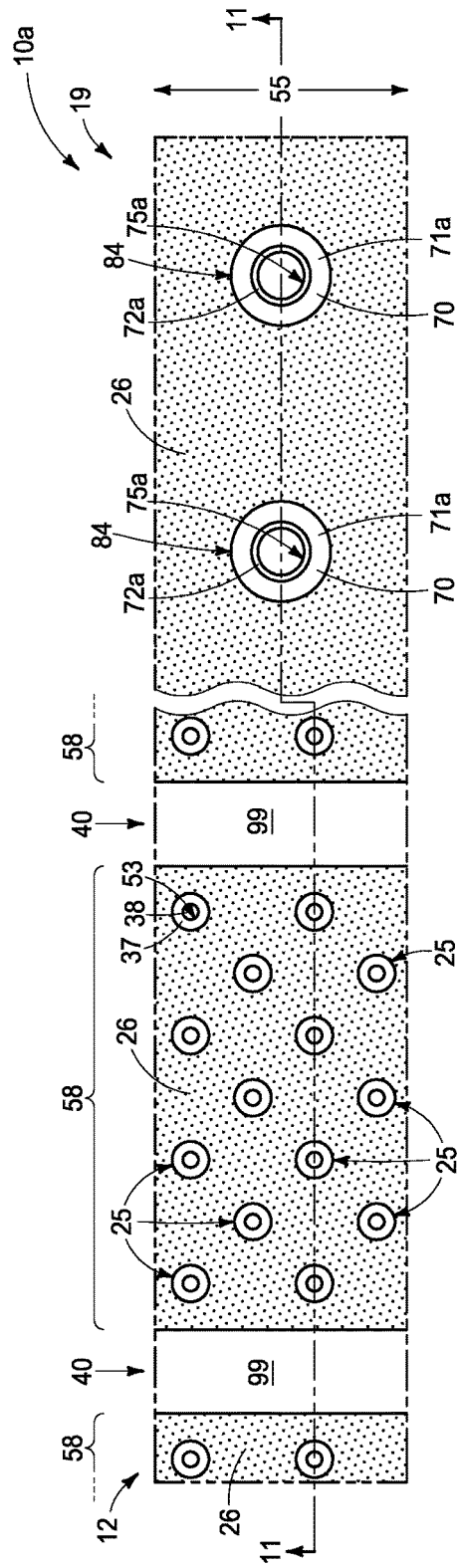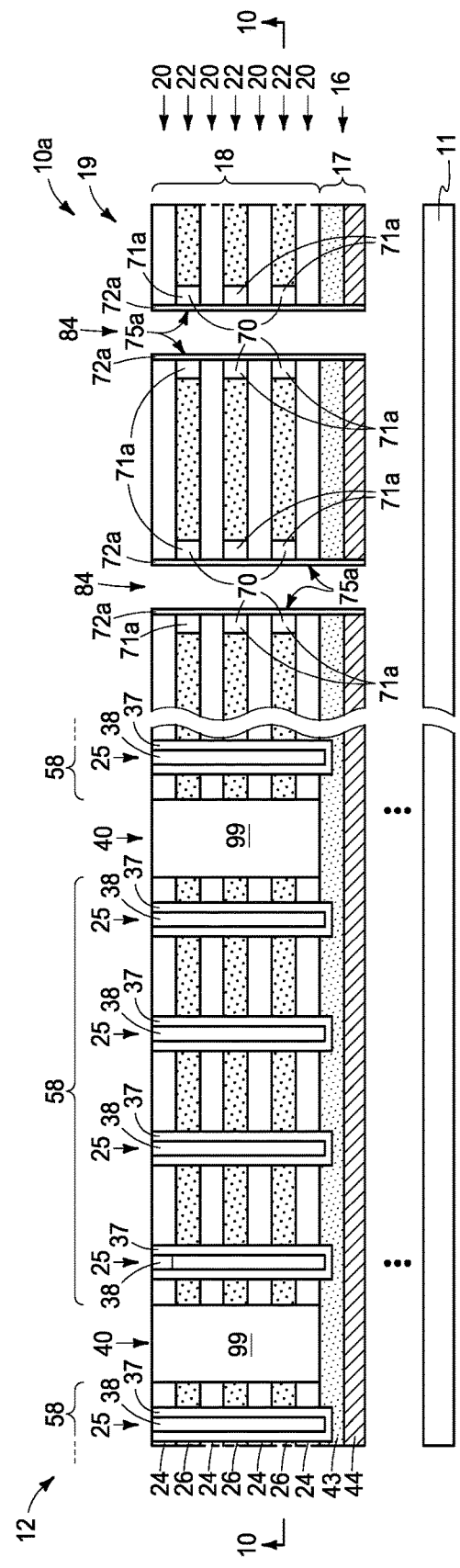

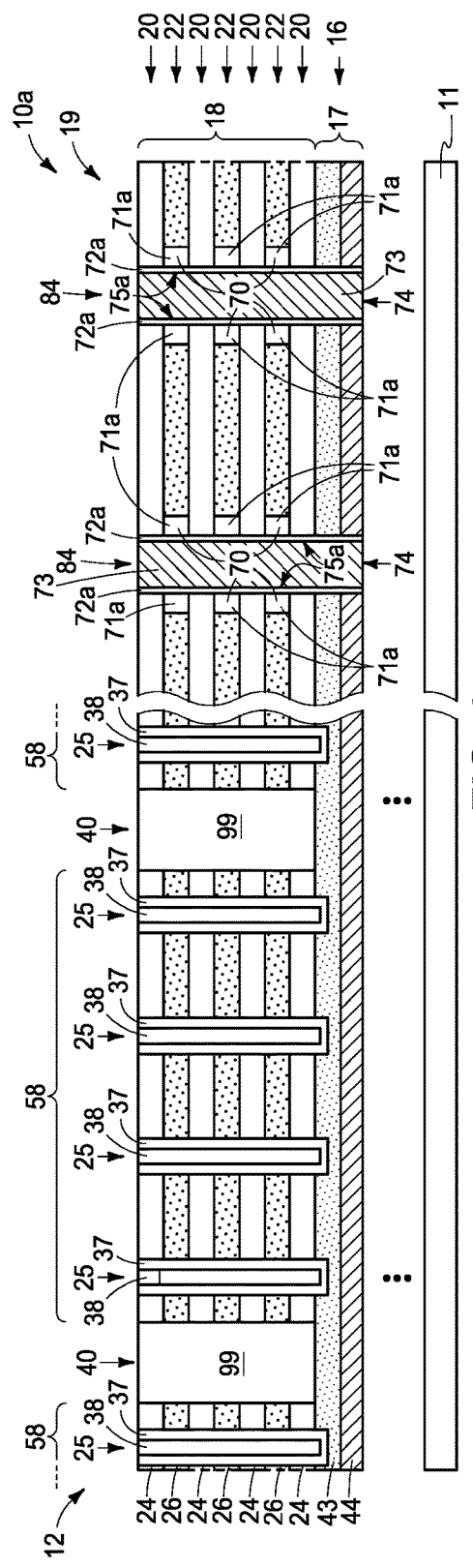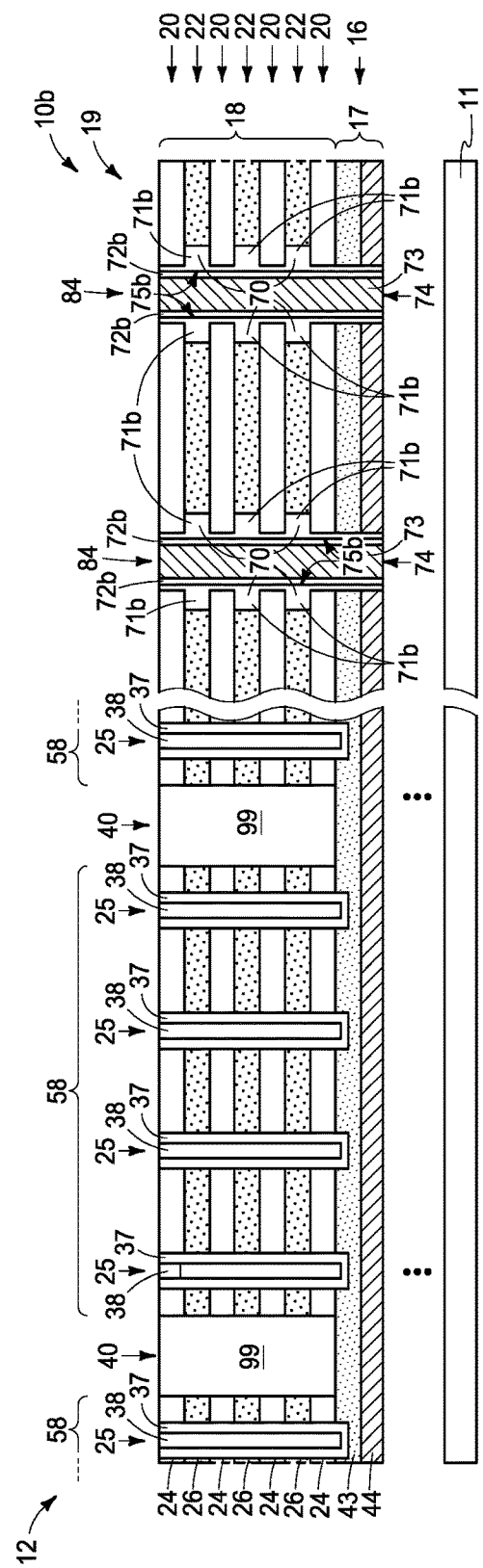
FIG. 17
FIG. 18

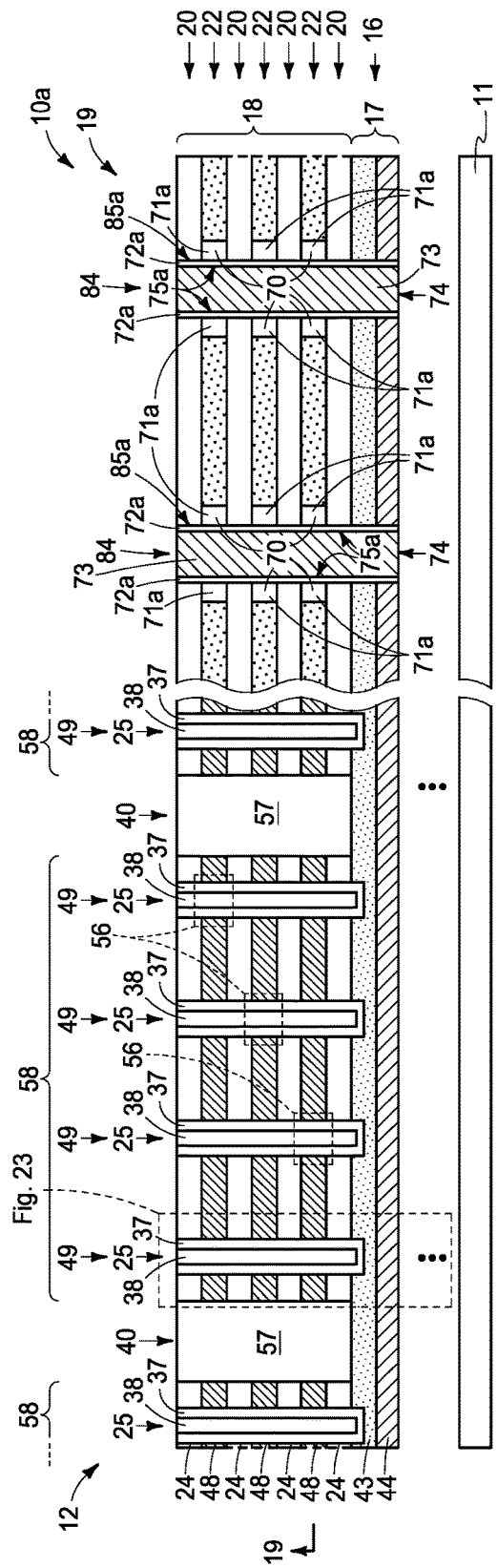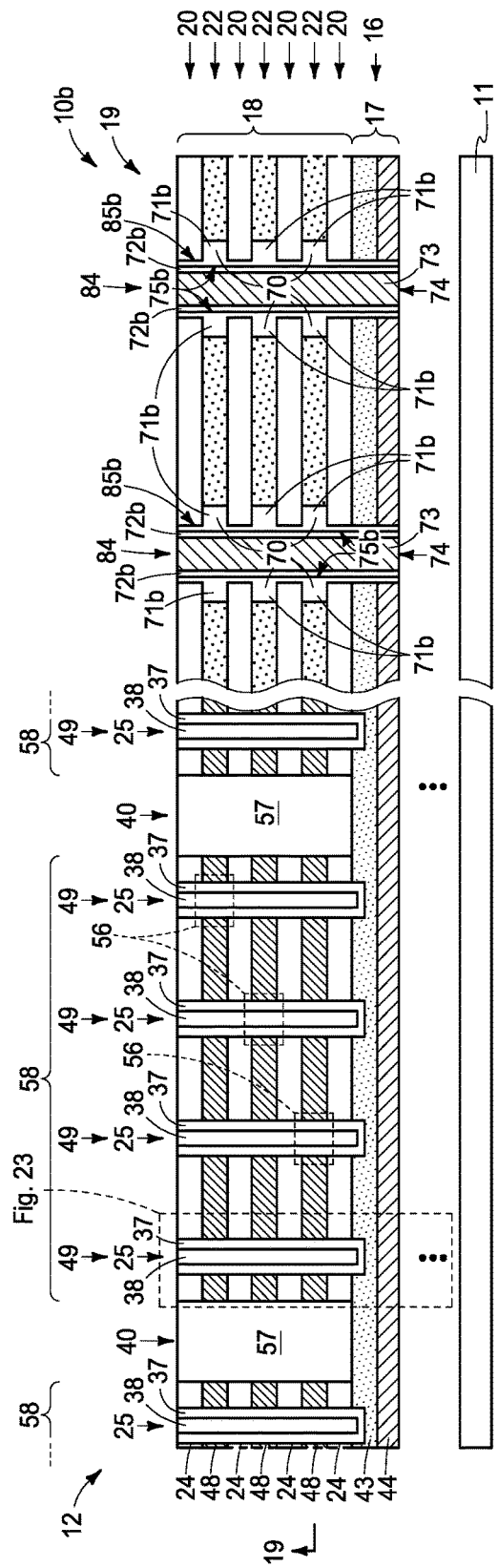

MEMORY ARRAYS COMPRISING STRINGS OF MEMORY CELLS AND METHODS USED IN FORMING A MEMORY ARRAY COMPRISING STRINGS OF MEMORY CELLS

TECHNICAL FIELD

Embodiments disclosed herein pertain to memory arrays comprising strings of memory cells and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region therebetween. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

BRIEF DESCRIPTION OF THE DRAWINGS

FIGS. 6-25 are diagrammatic sequential sectional and/or enlarged views of the construction of FIGS. 2-5, or portions thereof or alternate and/or additional embodiments, in process in accordance with some embodiments of the invention.

DETAILED DESCRIPTION OF EXAMPLE EMBODIMENTS

Embodiments of the invention encompass methods used in forming a memory array, for example an array of NAND or other memory cells having peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. Example method embodiments are described with reference to FIGS. 1-25 which may be considered as a "gate-last" or "replacement-gate" process. Further, and regardless, the following sequence of processing steps is but one example and other sequences of the example processing steps (with or without other processing steps) may be used regardless of whether using "gate-last/replacement-gate" processing.

Figure 1:
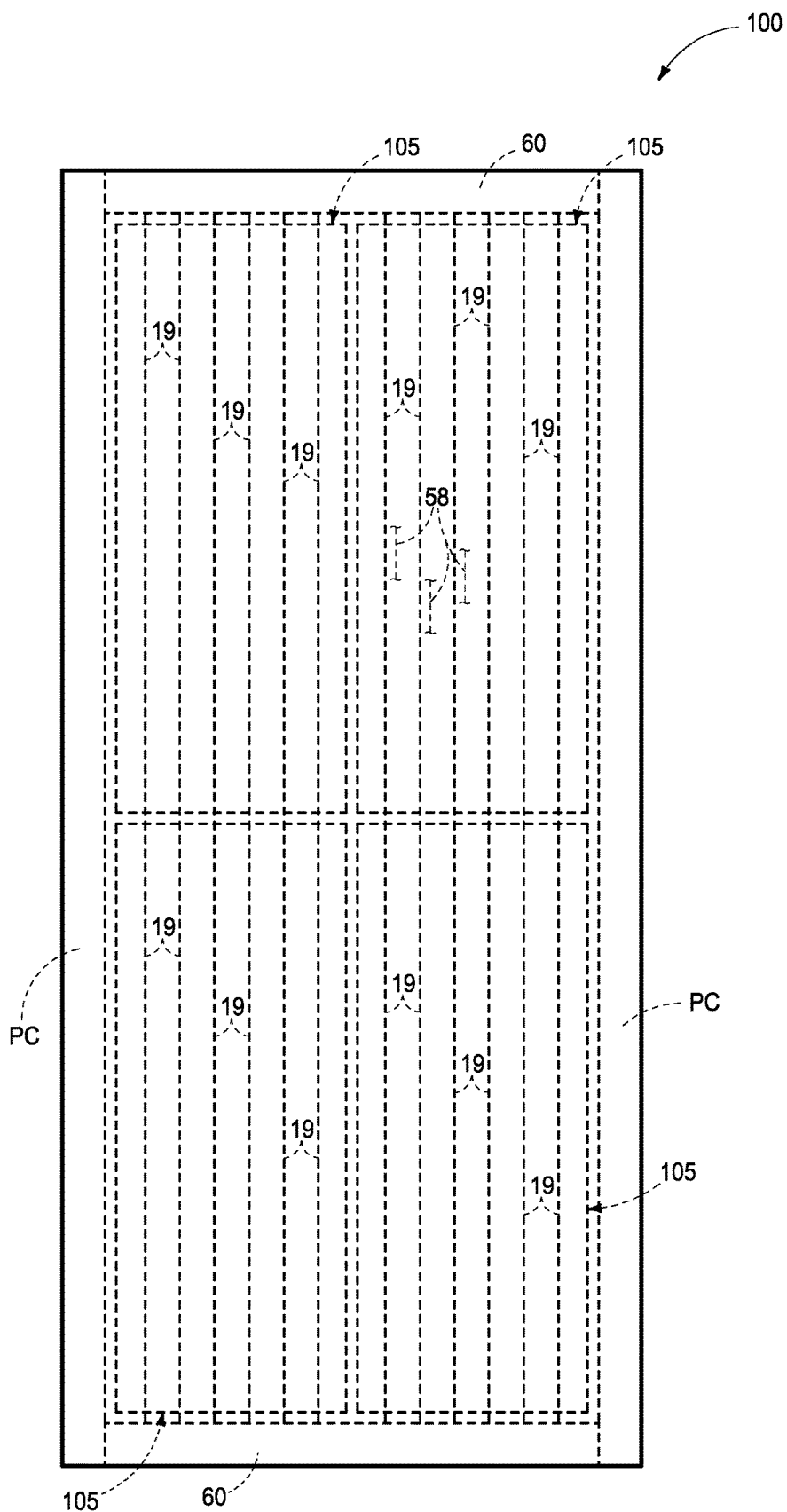
FIG. 1 is a diagrammatic top plan view of a die or die area that may be part of a larger substrate (e.g., a semiconductor wafer, and not shown).
Figure 2:
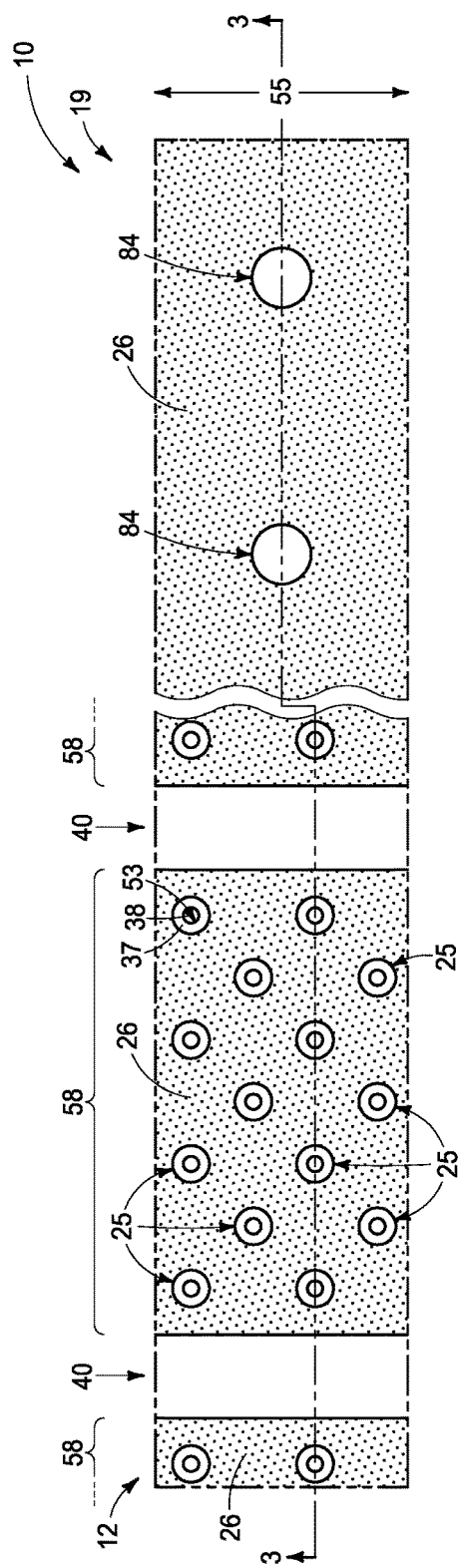
FIGS. 2-5 are diagrammatic cross-sectional views of portions of a construction (e.g., as part of FIG. 1) that will comprise an array of elevationally-extending strings of memory cells in accordance with an embodiment of the invention.
Figure 3:
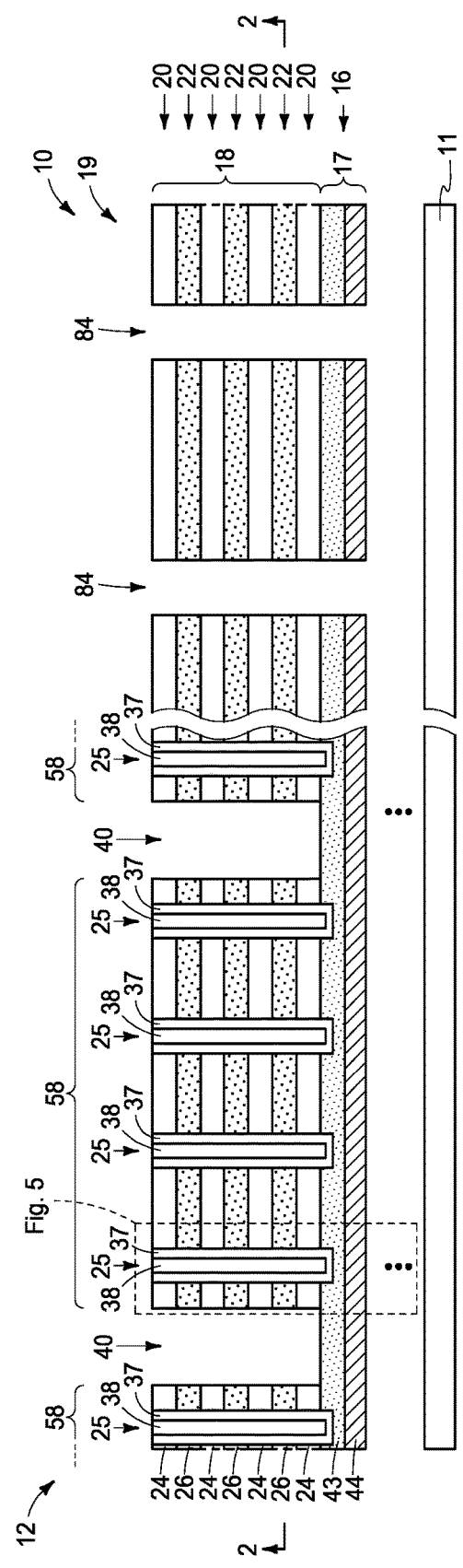
Figure 5:
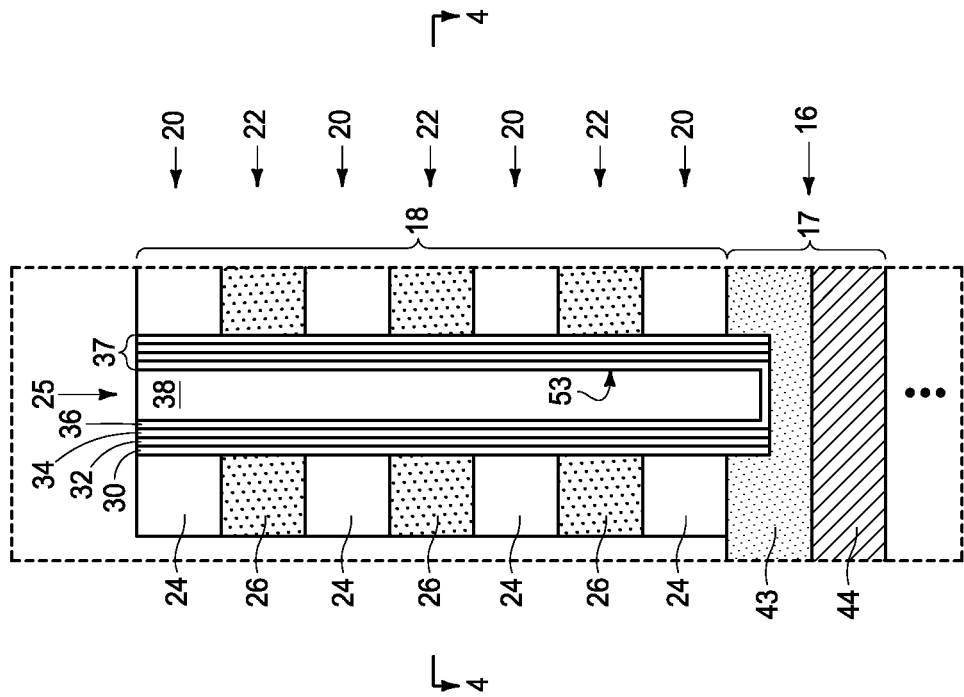
Figure 4:
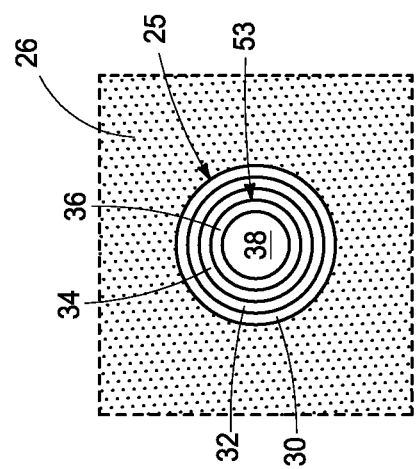

FIG. 1 shows an example diagrammatic embodiment comprising a die or die area 100 that may be part of a larger substrate (e.g., a semiconductor wafer, and not shown) and within which a memory array will be fabricated. Example die area 100 comprises at least one memory-plane region 105 (four being shown), memory-block regions 58 in individual memory-plane regions 105, a stair-step region 60 (two being shown at longitudinal ends of the memory planes), and a peripheral circuitry region PC (two being shown). In this document, "block" is generic to include "sub-block". Alternate orientations may be used, for example having a stair-step region between immediately-adjacent memory planes (not shown). Regions 105, 58, 60, and/or PC may not be discernable at this point of processing. FIGS. 2-5 are diagrammatic larger and varied scale views of portions of die area 100.

Referring to FIGS. 2-5, a construction 10 is shown in a method of forming an array or array region 12 of elevationally-extending strings of transistors and/or memory cells (not yet fabricated) and in forming a through-array-via (TAV) region 19. A "TAV region" is a region in which operative TAVs are present or will be formed. An "operative TAV" is a circuit-operative conductive interconnect extending through a stack 18* (described below; an * being used as a suffix to be inclusive of all such same-numerically-designated components that may or may not have other suffixes) and between electronic components at different elevations in a finished construction of integrated circuitry that has been or is being fabricated. A TAV region may also contain one or more dummy TAVs (i.e., a circuit-inoperative structure extending through a stack 18* in a finished construction of integrated circuitry that has been or is being fabricated). Example TAV region 19 may be in individual memory planes 105 (i.e., in-plane; e.g., FIG. 1) or be out-of-plane (i.e., outside of a memory-plane region [not shown]; e.g., edge-of-plane or in a stair-step region 60). By way of example only, example in-plane TAV regions 19 are so-designated in FIG. 1. The discussion proceeds with respect to a single TAV region 19, although likely multiple TAV regions to which the invention is applicable will exist and whether those multiple TAV regions are in-plane, out-of-plane, and/or a combination of in-plane and out-of-plane. A TAV region may be within a memory-block region (not shown).

Example construction 10 comprises a base substrate 11 comprising conductive/conductor/conducting, semiconductive/semiconductor/semiconducting, and/or insulative/insulator/insulating (i.e., electrically herein) materials. Various materials have been formed elevationally over base substrate 11. Materials may be aside, elevationally inward, or elevationally outward of the FIGS. 2-5-depicted materials. For example, other partially or wholly fabricated components of integrated circuitry may be provided somewhere above, about, or within base substrate 11. Control and/or other peripheral circuitry for operating components in an array (e.g., array 12 or memory-array region 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 has been formed above substrate 11. Conductor material 17 as shown comprises upper conductor material 43 directly above and directly electrically coupled to (e.g., directly against) lower conductor material 44 of different composition from upper conductor material 43. In one embodiment, upper conductor material 43 comprises conductively-doped semiconductive material (e.g., n-type-doped or p-type-doped polysilicon). In one embodiment, lower conductor material 44 comprises metal material (e.g., a metal silicide such as $WSi_x$). Conductor tier 16 may comprise part of control circuitry (e.g., peripheral-under-array circuitry and/or a common source line or plate) used to control read and write access to the transistors and/or memory cells that will be formed within array 12.

A stack 18 comprising vertically-alternating insulative tiers 20 and conductive tiers 22 has been formed above conductor tier 16. Example thickness for each of tiers 20 and 22 is 22 to 60 nanometers. Only a small number of tiers 20 and 22 is shown, with more likely stack 18 comprising dozens, a hundred or more, etc. of tiers 20 and 22. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22 and/or above an uppermost of the conductive tiers 22. For example, one or more select gate tiers (not shown) may be between conductor tier 16 and the lowest conductive tier 22 and one or more select gate tiers may be above an uppermost of conductive tiers 22. Alternately or additionally, at least one of the depicted uppermost and lowest conductive tiers 22 may be a select gate tier. Regardless, conductive tiers 22 (alternately referred to as first tiers) may not comprise conducting material and insulative tiers 20 (alternately referred to as second tiers) may not comprise insulative material or be insulative at this point in processing in conjunction with the hereby initially-described example method embodiment which is "gate-last" or "replacement-gate". Example insulative tiers 20 comprise second material 24 (e.g., silicon dioxide) which may be wholly or partially sacrificial and example conductive tiers comprise first material 26 (e.g., silicon nitride) which may be wholly or partially sacrificial.

Stack 18 comprises laterally-spaced memory-block regions 58 as part of one of memory-plane regions 105 and that will comprise laterally-spaced memory blocks 58 in a finished circuitry construction. In this document, unless otherwise indicated, "block" is generic to include "sub-block". Memory-block regions 58 and resultant memory blocks 58 (not yet shown) may be considered as being longitudinally elongated and oriented, for example, horizontally-parallel relative one another along a direction 55. Memory-block regions 58 may not be discernable at this point of processing.

Channel openings 25 have been formed (e.g., by etching) through second tiers 20 and first tiers 22 to conductor tier 16. Channel openings 25 may taper radially-inward (not shown) moving deeper in stack 18. In some embodiments, channel openings 25 may go into conductor material 17 of conductor tier 16 as shown or may stop there-atop (not shown). Alternately, as an example, channel openings 25 may stop atop or within the lowest second tier 20. A reason for extending channel openings 25 at least to into conductor material 17 of conductor tier 16 is to provide an anchoring effect to material that is within channel openings 25. Etch-stop material (not shown) may be within or atop conductor material 17 of conductor tier 16 to facilitate stopping of the etching of channel openings 25 relative to conductor tier 16 when such is desired. Such etch-stop material may be sacrificial or non-sacrificial.

Transistor channel material may be formed in the individual channel openings elevationally along the insulative tiers and the conductive tiers, thus comprising individual channel-material strings, which is directly electrically coupled with conductor material in the conductor tier. Individual memory cells of the example memory array being formed may comprise a gate region (e.g., a control-gate region) and a memory structure laterally-between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally-between the channel material and the storage material.

In one embodiment and as shown, charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18* and within individual openings 25 followed by planarizing such back at least to a top surface of stack 18*.

Channel material 36 as a channel-material string 53 has also been formed in channel openings 25 elevationally along insulative tiers 20 and conductive tiers 22. Materials 30, 32, 34, and 36 are collectively shown as and only designated as material 37 in some figures due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted to remove materials 30, 32, and 34 from the bases of channel openings 25 (not shown) to expose conductor tier 16 such that channel material 36 is directly against conductor material 17 of conductor tier 16. Such punch etching may occur separately with respect to each of materials 30, 32, and 34 (as shown) or may occur with respect to only some (not shown). Alternately, and by way of example only, no punch etching may be conducted and channel material 36 may be directly electrically coupled to conductor material 17 of conductor tier 16 only by a separate conductive interconnect (not yet shown). Regardless, sacrificial etch-stop plugs (not shown) may be formed in lower portion 18L in horizontal locations where channel openings 25 will be prior to forming upper portion 18U. Channel openings 25 may then be formed by etching materials 24 and 26 to stop on or within the material of the sacrificial plugs, followed by exhuming remaining material of such plugs prior to forming material in channel openings 25. A radially-central solid dielectric material 38 (e.g., spin-on-dielectric, silicon dioxide, and/or silicon nitride) is shown in channel openings 25. Alternately, and by way of example only, the radially-central portion within channel openings 25 may include void space(s) (not shown) and/or be devoid of solid material (not shown).

TAV openings 84 have been formed in TAV region 19. TAV openings 84 may go to, through, or only into conductor tier 16. TAV openings 84 may taper laterally-inward or laterally-outward moving deeper into stack 18* (not shown).

In one embodiment, horizontally-elongated trenches 40 have been formed (e.g., by anisotropic etching) into stack 18 to conductor tier 16 and that are individually between immediately-laterally-adjacent memory-block regions 58. A sacrificial etch-stop line (not shown) having the same general horizontal outline as trenches 40 may individually be formed below stack 18 prior to forming trenches 40. Trenches 40 may then be formed by etching materials 24 and 26 to stop on or within the material of the individual sacrificial lines, followed by exhuming remaining material of such sacrificial lines. One or more trenches 40 may be formed directly against TAV region 19 (not shown) including, for example, partially there-within (not shown). Alternately, a trench 40 that is closest to TAV region 19 may be laterally spaced therefrom. Trenches 40 may taper laterally-inward or laterally-outward moving deeper into stack 18* (not shown). By way of example and for brevity only, channel openings 25 are shown as being arranged in groups or columns of staggered rows of three and four channel openings 25 per row. Trenches 40 will typically be wider than channel openings 25 (e.g., 3 to 10 times wider). Any alternate existing or future-developed arrangement and construction may be used. Trenches 40, TAV openings 84, and channel openings 25 may be formed in any order relative the other or at the same time(s).

Trenches 40, channel openings 25, and TAV openings 84 (and/or material subsequently formed therein) may be formed in any order relative the other or at the same time or at one or more different times.

A radially-outer insulative lining is formed in individual of the TAV openings. The insulative lining comprises a radially-inner insulative material extending elevationally along the first tiers and the second tiers and comprises a radially-outer insulative material. The radially-inner insulative material and the radially-outer insulative material are of different compositions relative one another. The radially-outer insulative material may or may not extend elevationally along the second tiers. The radially-outer insulative material and/or the radially-inner insulative material may comprise $Si_{1-x-y}C_xO_y$, where "x" is $1\times10^{-6}$ to 0.5, "y" is 0.01 to 0.8, and "1-x-y" is greater than 0 and in one such embodiment where "x" is 0.05 to 0.2 and "y" is 0.4 to 0.6. In one embodiment where the radially-outer insulative material comprises the $Si_{1-x-y}C_xO_y$, the radially-inner insulative material at least predominantly (i.e., herein more than 50 atomic percent up to and including 100 atomic percent) comprises $SiO_2$. In one embodiment where the radially-inner insulative material comprises the $Si_{1-x-y}C_xO_y$, the radially-outer insulative material at least predominantly comprises $SiO_2$. Each of the radially-outer insulative material and the radially-inner insulative material may comprise the $Si_{1-x-y}C_xO_y$, if comprising different at least one of "x" and "y" whereby such materials are of different compositions relative one another.

In one embodiment, the radially-inner insulative material and the radially-outer insulative material at least predominantly comprise $SiO_2$ and the radially-outer insulative material has less, if any, dopant than the radially-inner insulative material, where the dopant comprises at least one of carbon, boron, nitrogen, gallium, and metal material. In one such embodiment, total dopant concentration in the radially-inner insulative material is $1\times10^{-9}$ atomic percent to 30 atomic percent, and in one such embodiment, is 0.1 atomic percent to 10 atomic percent.

In one embodiment, the radially-outer insulative material at least predominantly comprises $SiO_2$ and the radially-inner insulative material comprises at least one of an insulative metal oxide, silicon nitride, and boron nitride. In one such embodiment, the radially-inner insulative material comprises an insulative metal oxide comprising at least one of hafnium oxide, aluminum oxide, magnesium oxide, magnesium aluminum oxide, niobium oxide, and tungsten oxide. In one embodiment, the radially-inner insulative material at least predominantly comprises $SiO_2$ and the radially-outer insulative material comprises at least one of an insulative metal oxide, silicon nitride, and boron nitride. In one such embodiment, the radially-outer insulative material comprises an insulative metal oxide comprising at least one of hafnium oxide, aluminum oxide, magnesium oxide, magnesium aluminum oxide, niobium oxide, and tungsten oxide.

Any other attribute(s) or aspect(s) as shown and/or described herein with respect to other embodiments may be used.

One example method of forming a radially-outer insulative lining is next described with reference to FIGS. 6-9.

Referring to FIGS. 6 and 7, and in one embodiment, TAV openings 84 have been widened in first tiers 22 (e.g., by isotropic etching material 26 inside TAV openings 84) to form radially-outer recesses 70 in first tiers 22 as compared to second tiers 20. Material 26 within trenches 40 might not be etched in memory-block regions 58 (as shown), for example if trenches 40 were not previously formed or if so formed if masking/sacrificial material 99 is formed therein so that processing occurring with respect to TAV openings 84 does not occur with respect to memory-block regions 58 (no trench widening in first tiers 22 being shown in trenches 40 due to presence of material 99).

Referring to FIGS. 8 and 9, a radially-outer insulative material 71 has been formed in TAV openings 84 elevationally along first tiers 22 and second tiers 20 and in recesses 70 to less-than-fill individual recesses 70. Thereafter, a radially-inner insulative material 72 has been formed in TAV openings 84 radially-inward of radially-outer insulative material 71, with radially-inner insulative material 72 and radially-outer insulative material 71 being of different compositions relative one another. Radially-inner insulative material 72 is in and fills remaining volume of individual recesses 70 and is elevationally along first tiers 22 and second tiers 20 to less-than-fill remaining volume of individual TAV openings 84. Radially-inner insulative material 72 and radially-outer insulative material 71 comprise a radially-outer insulative lining 75.

Any other attribute(s) or aspect(s) as shown and/or described herein with respect to other embodiments may be used.

Another example method of forming a radially-outer insulative lining is next described with reference to FIGS. 10 and 11 and a construction 10a having a radially-outer insulative lining 75a. Like numerals from the above-described embodiments have been used where appropriate, with some construction differences being indicated with the suffix "a" or with different numerals. In one embodiment and as shown, radially-outer insulative material 71a has been formed in TAV openings 84 elevationally along first tiers 22 and second tiers 20 and to fill recesses 70. Thereafter, radially-inner insulative material 72a has been formed in TAV openings 84 elevationally along first tiers 22 and second tiers 20 radially-inward of radially-outer insulative material 71a to less-than-fill remaining volume of individual TAV openings 84, with radially-inner insulative material 72a and radially-outer insulative material 71a being of different compositions relative one another. Any other attribute(s) or aspect(s) as shown and/or described herein with respect to other embodiments may be used.

Figure 12:
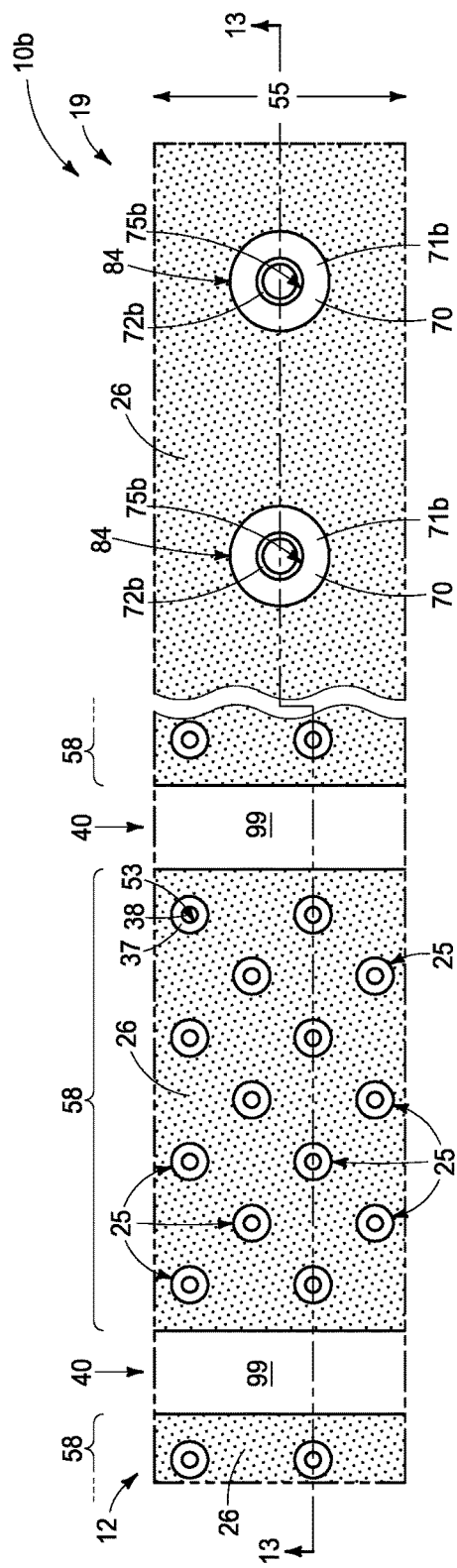
Figure 13:
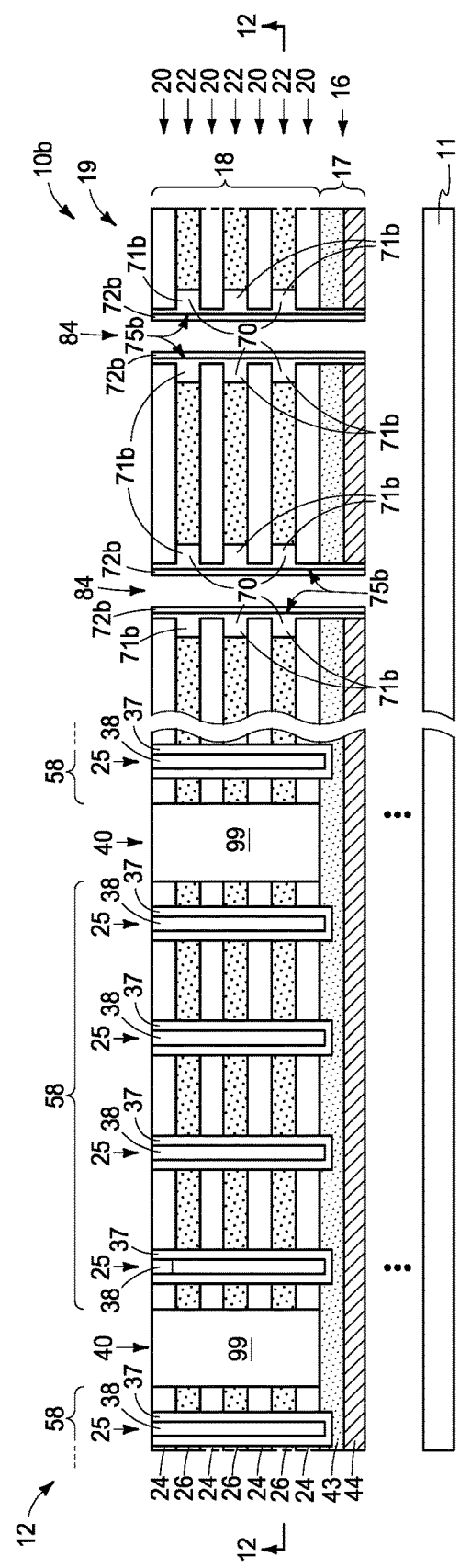

FIGS. 10 and 11 show an embodiment wherein radially-outer insulative material 71a does not extend elevationally along second tiers 20. Alternately, a radially-outer insulative material 71* may extend elevationally along second tiers 22, for example as shown with respect to construction 10 in FIGS. 8 and 9. An alternate embodiment such a construction 10b is shown in FIGS. 12 and 13 that has radially-outer insulative lining 75b comprising radially-outer insulative material 71b and radially-inner insulative material 72b in. Like numerals from the above-described embodiments have been used where appropriate, with some construction differences being indicated with the suffix "b" or with different numerals. Any other attribute(s) or aspect(s) as shown and/or described herein with respect to other embodiments may be used.

Figure 14:
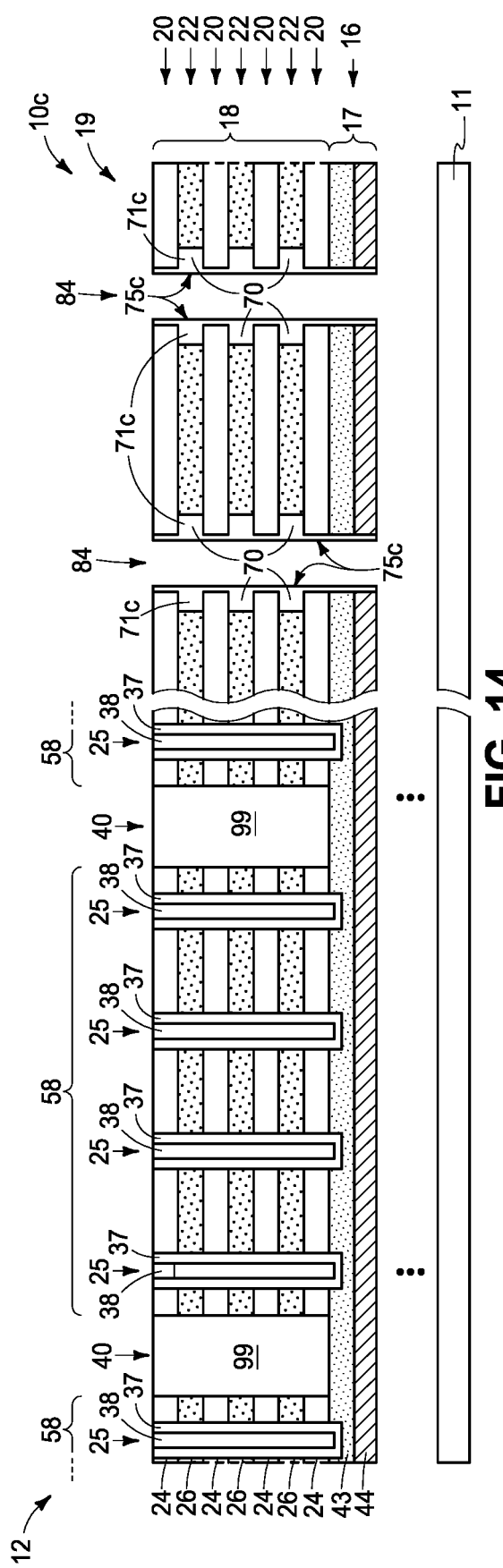

An alternate example method embodiment is described with reference to FIGS. 14 and 11. Like numerals from the above-described embodiments have been used where appropriate, with some construction differences being indicated with the suffix "c" or with different numerals. Referring to FIG. 14, in construction 10c, radially-outer insulative material 71c as part of radially-outer insulative lining 75c has been formed. Referring to FIG. 11, a radially-inner portion of such radially-outer insulative material has been treated to form the radially-inner insulative material (e.g., material 72*), for example to result in construction 10a comprising radially-inner insulative material 72a and radially-outer insulative material 71a. Any method of treating may be used, with at least one of ion implantation and diffusion doping being ideal. Other constructions may result (e.g., construction 10b in FIG. 13, depending on thickness of the initially-deposited radially-outer insulative material 71*, method of treating, time of treating, etc.) Any other attribute(s) or aspect(s) as shown and/or described herein with respect to other embodiments may be used.

Figure 15:
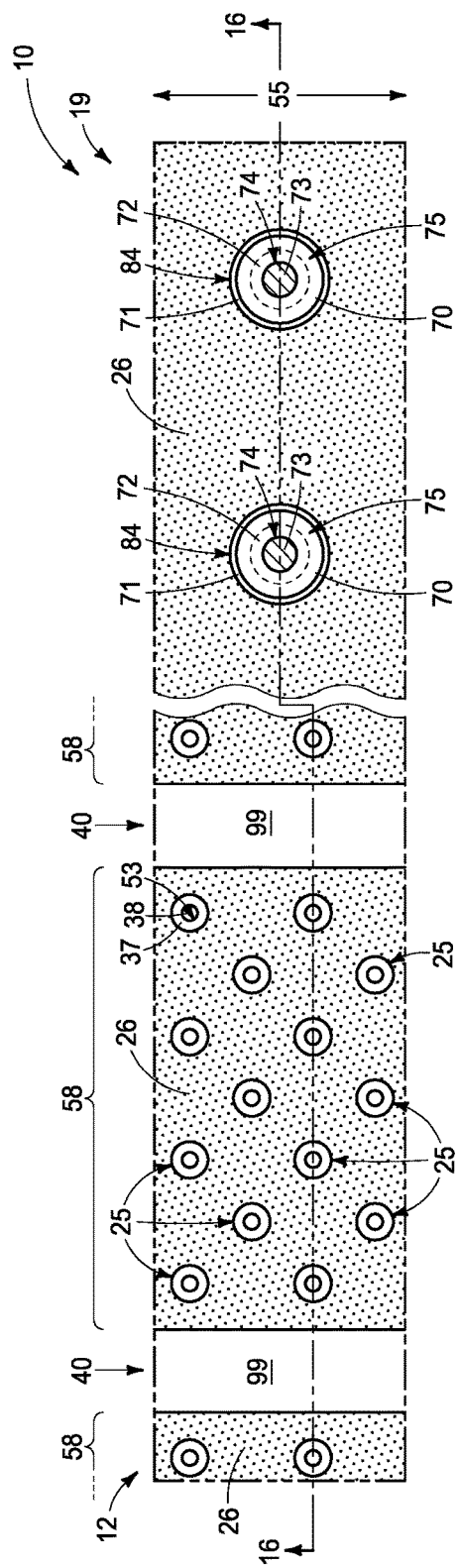
Figure 16:
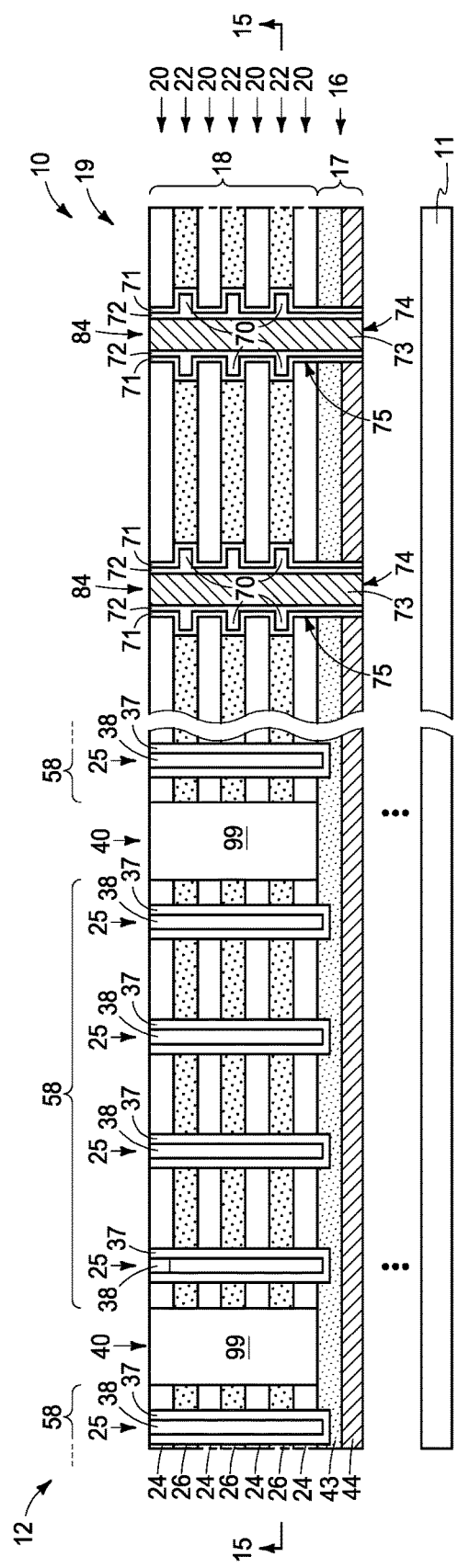
Figure 19:
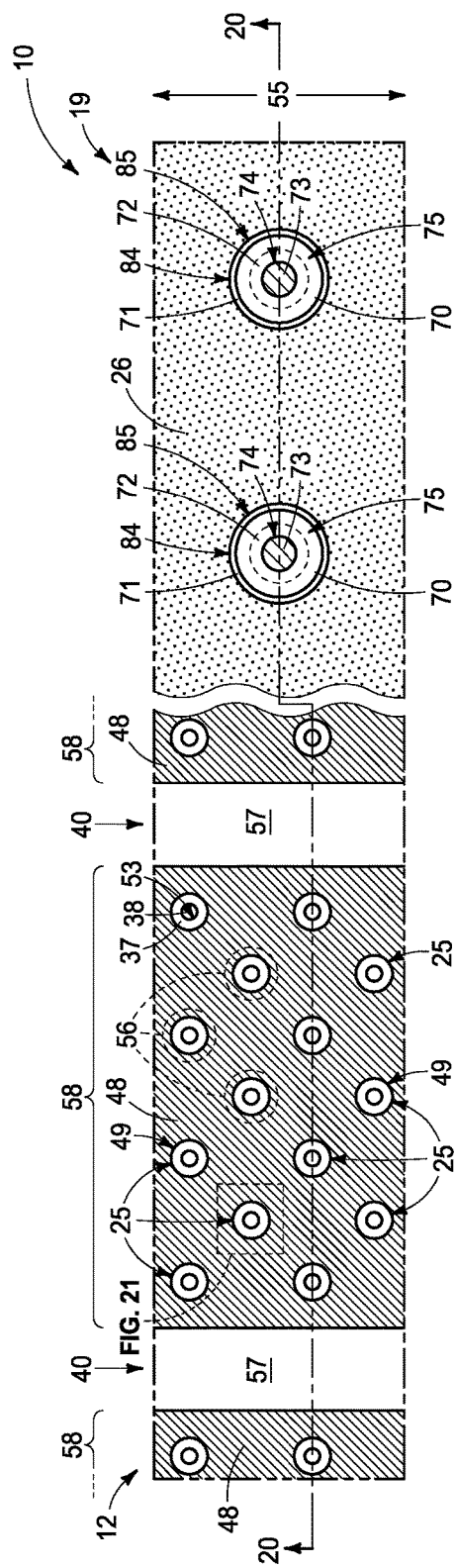
Figure 20:
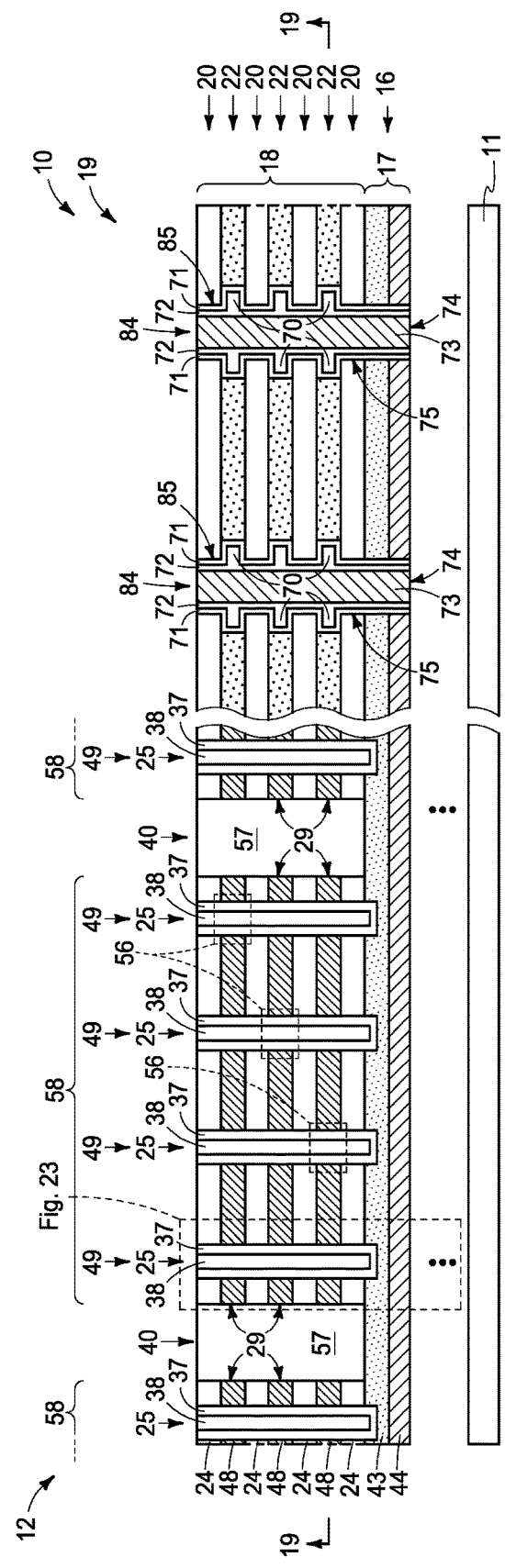
Figure 23:
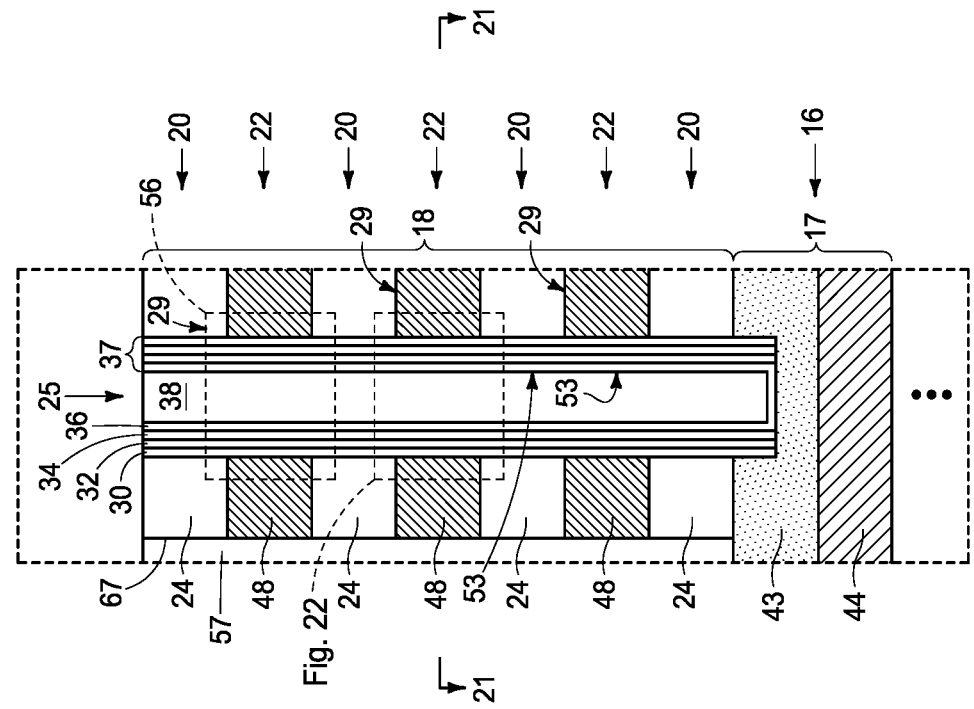
Figure 21:
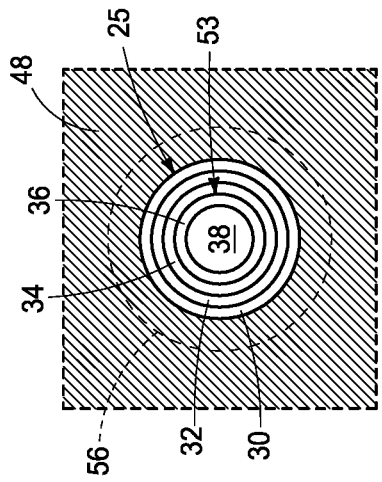
Figure 22:
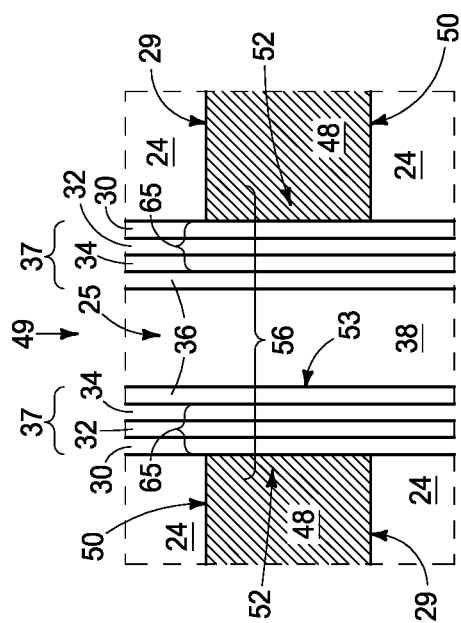

Referring to FIGS. 15 and 16, a conductive core 73 (e.g., a TiN lining having W radially-inward thereof) has been formed in individual TAV openings 84 elevationally along vertically-alternating first tiers 22 and second tiers 20 radially-inward of radially-inner insulative material 72 to form a TAV 74 in individual TAV openings 84. FIGS. 17 and 18 show analogous constructions 10a and 10b, respectively.

Referring to FIGS. 19-23, sacrificial material 99 (not shown) has been removed (e.g., by isotropic etching) and material 26 of conductive tiers 22 in array region 12 has been removed, for example by being isotropically etched away through trenches 40 ideally selectively relative to the other exposed materials (e.g., using liquid or vapor $H_3PO_4$ as a primary etchant where material 26 is silicon nitride and other materials comprise one or more oxides or polysilicon). Material 26 in conductive tiers 22 in array region 12 in the example embodiment is sacrificial and has been replaced with conducting material 48, and which has thereafter been removed from trenches 40, thus forming individual conductive lines 29 (e.g., wordlines) and elevationally-extending strings 49 of individual transistors and/or memory cells 56.

Some, all, or none of material 26 may be removed from TAV region 19 (no removal therefrom being shown), for example depending on proximity of trenches 40 that are closest thereto and/or presence or lack thereof of etch-blocking material(s)/structure(s) in tiers 22 in upper portion 18U (not shown).

A thin insulative liner (e.g., $Al_2O_3$ and not shown) may be formed before forming conducting material 48. Approximate locations of some transistors and/or some memory cells 56 are indicated with a bracket or with dashed outlines, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22 is formed after forming openings 25 and/or trenches 40. Alternately, the conducting material of the conductive tiers may be formed before forming channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Intervening material 57 has been formed in trenches 40 and thereby laterally-between and longitudinally-along immediately-laterally-adjacent memory blocks 58. Intervening material 57 may provide lateral electrical isolation (insulation) between immediately-laterally-adjacent memory blocks. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, $Al_2O_3$, and undoped polysilicon. In this document, "undoped" is a material having from 0 atoms/cm$^3$ to $1\times10^{12}$ atoms/cm$^3$ of atoms of conductivity-increasing impurity in said material. In this document, "doped" is a material having more than $1\times10^{12}$ atoms/cm$^3$ of atoms of conductivity-increasing impurity therein and "conductively-doped" is material having at least $1\times10^{18}$ atoms/cm$^3$ of atoms of conductivity-increasing impurity therein. Intervening material 57 may include through array vias (not shown). FIGS. 24 and 25 show analogous constructions 10a and 10b, respectively.

Any other attribute(s) or aspect(s) as shown and/or described herein with respect to other embodiments may be used.

In one embodiment, a method used in forming a memory array (e.g., 12) comprising strings (e.g., 49) of memory cells (e.g., 56) comprises forming a stack (e.g., 18) comprising vertically-alternating first tiers (e.g., 22) and second tiers (e.g., 20). The stack comprises laterally-spaced memory-block regions (e.g., 58) and a TAV region (e.g., 19). The stack comprises channel-material strings (e.g., 53) extending through the first tiers and the second tiers in the memory-block regions. The stack comprises TAV openings (e.g., 84) in the TAV region. A radially-outer insulative lining (e.g., 75, 75a, 75b) is formed in individual of the TAV openings. The insulative lining comprises a radially-inner insulative material (e.g., 72, 72a, 72b) extending elevationally along the first tiers and the second tiers and comprises a radially-outer insulative material (e.g., 71, 71a, 71b). The radially-inner insulative material and the radially-outer insulative material being of different compositions relative one another. A conductive core (e.g., 73) is formed in the individual TAV openings elevationally along the vertically-alternating first tiers and second tiers radially-inward of the insulative lining to form a TAV (e.g., 74) in the individual TAV openings. Any other attribute(s) or aspect(s) as shown and/or described herein with respect to other embodiments may be used.

Forming a radially-outer insulative lining as described herein may increase etch resistance to certain etching chemistries that contact such lining and that could lead to fatal shorting to TAVs.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, a memory array (e.g., 12) comprising strings (e.g., 49) of memory cells (e.g., 56) comprises laterally-spaced memory blocks (e.g., 58) individually comprising a vertical stack (e.g., 18) comprising alternating insulative tiers (e.g., 20) and conductive tiers (e.g., 22). The strings of memory cells comprise channel-material strings (e.g., 53) that extend through the insulative tiers and the conductive tiers in the memory blocks. A TAV region (e.g., 19) comprises TAV constructions (e.g., 85, 85a, 85b) that extend through the insulative tiers and the conductive tiers. The TAV constructions individually comprise a radially-outer insulative lining (e.g., 75, 75a, 75b) and a conductive core (e.g., 73) radially-inward of the insulative lining. The insulative lining comprises a radially-inner insulative material (e.g., 72, 72a, 72b) extending elevationally along the insulative tiers and the conductive tiers and comprising a radially-outer insulative material (e.g., 71, 71a, 71b). The radially-inner insulative material and the radially-outer insulative material are of different compositions relative one another. Any other attribute(s) or aspect(s) as shown and/or described herein with respect to other embodiments may be used.

In one embodiment, a memory array (e.g., 12) comprising strings (e.g., 49) of memory cells (e.g., 56) comprises laterally-spaced memory blocks (e.g., 58) individually comprising a vertical stack (e.g., 18) comprising alternating insulative tiers (e.g., 20) and conductive tiers (e.g., 22). The strings of memory cells comprise channel-material strings (e.g., 53) that extend through the insulative tiers and the conductive tiers in the memory blocks. A TAV region (e.g., 19) comprises TAV constructions (e.g., 85) that extend through the insulative tiers and the conductive tiers. The TAV constructions individually comprise a radially-outer insulative lining (e.g., 75) and a conductive core (e.g., 73) radially-inward of the insulative lining. The insulative lining comprising a radially-inner insulative material (e.g., 72) extending elevationally along the insulative tiers and the conductive tiers and comprises a radially-outer insulative material (e.g., 71) extending elevationally along the insulative tiers and the conductive tiers. The radially-inner insulative material and the radially-outer insulative material are of different compositions relative one another. The radially-outer insulative material lines radially-outer recesses (e.g., 70) that are in the first tiers as compared to the second tiers. The radially-inner insulative material is in individual of the recesses vertically-between upper and lower portions of the radially-outer insulative material that are in the individual recesses. Any other attribute(s) or aspect(s) as shown and/or described herein with respect to other embodiments may be used.

In one embodiment, a memory array (e.g., 12) comprising strings (e.g., 49) of memory cells (e.g., 56) comprises laterally-spaced memory blocks (e.g., 58) individually comprising a vertical stack (e.g., 18) comprising alternating insulative tiers (e.g., 20) and conductive tiers (e.g., 22). The strings of memory cells comprise channel-material strings (e.g., 53) that extend through the insulative tiers and the conductive tiers in the memory blocks. A TAV region (e.g., 19) comprises TAV constructions (e.g., 85*a*, 85*b*) that extend through the insulative tiers and the conductive tiers. The TAV constructions individually comprise a radially-outer insulative lining (e.g., 75*a*, 75*b*) and a conductive core (e.g., 73) radially-inward of the insulative lining. The insulative lining comprising a radially-inner insulative material (e.g., 72*a*, 72*b*) and a radially-outer insulative material (e.g., 71*a*, 71*b*) that are of different compositions relative one another. The radially-outer insulative material is in radially-outer recesses (e.g., 70) that are in the first tiers as compared to the second tiers. The radially-inner insulative material extends elevationally along the insulative tiers and the conductive tiers.

In one embodiment, the radially-inner insulative material is not in the radially-outer recesses. In one embodiment, the radially-outer insulative material does not extend elevationally along the insulative tiers. In one embodiment, the radially-outer insulative material extends elevationally along the insulative tiers.

Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprising strings of memory cells comprises forming a stack comprising vertically-alternating first tiers and second tiers. The stack comprises laterally-spaced memory-block regions and a through-array-via (TAV) region. The stack comprises channel-material strings extending through the first tiers and the second tiers in the memory-block regions. The stack comprises TAV openings in the TAV region. A radially-outer insulative lining is formed in individual of the TAV openings. The insulative lining comprises a radially-inner insulative material extending elevationally along the first tiers and the second tiers and comprises a radially-outer insulative material. The radially-inner insulative material and the radially-outer insulative material are of different compositions relative one another. A conductive core is formed in the individual TAV openings elevationally along the vertically-alternating first tiers and second tiers radially-inward of the insulative lining to form a TAV in the individual TAV openings.

In some embodiments, a method used in forming a memory array comprising strings of memory cells comprises forming a stack comprising vertically-alternating first tiers and second tiers. The stack comprises laterally-spaced memory-block regions and a through-array-via (TAV) region. The stack comprises channel-material strings extending through the first tiers and the second tiers in the memory-block regions. The stack comprises TAV openings in the TAV region. The TAV openings in the first tiers are widened to form radially-outer recesses in the first tiers as compared to the second tiers. A radially-outer insulative material is formed in the TAV openings elevationally along the first tiers and the second tiers and in the recesses to less-than-fill individual of the recesses. A radially-inner insulative material is formed in the TAV openings radially-inward of the radially-outer insulative material. The radially-inner insulative material and the radially-outer insulative material are of different compositions relative one another. The radially-inner insulative material is in and fills remaining volume of the individual recesses and is elevationally along the first tiers and the second tiers to less-than-fill remaining volume of individual of the TAV openings. A conductive core is formed in the individual TAV openings elevationally along the vertically-alternating first tiers and second tiers radially-inward of the radially-inner insulative material to form a TAV in the individual TAV openings.

In some embodiments, a method used in forming a memory array comprising strings of memory cells comprises forming a stack comprising vertically-alternating first tiers and second tiers. The stack comprises laterally-spaced memory-block regions and a through-array-via (TAV) region. The stack comprises channel-material strings extending through the first tiers and the second tiers in the memory-block regions. The stack comprises TAV openings in the TAV region. The TAV openings in the first tiers are widened to form radially-outer recesses in the first tiers as compared to the second tiers. A radially-outer insulative material is formed in the TAV openings elevationally along the first tiers and the second tiers and to fill the recesses. A radially-inner insulative material is formed in the TAV openings elevationally along the first tiers and the second tiers radially-inward of the radially-outer insulative material to less-than-fill remaining volume of individual of the TAV openings. The radially-inner insulative material and the radially-outer insulative material are of different compositions relative one another. A conductive core is formed in the individual TAV openings elevationally along the vertically-alternating first tiers and second tiers radially-inward of the radially-inner insulative material to form a TAV in the individual TAV openings.

In some embodiments, a memory array comprising strings of memory cells comprises laterally-spaced memory blocks individually comprising a vertical stack comprising alternating insulative tiers and conductive tiers. Strings of memory cells comprise channel-material strings that extend through the insulative tiers and the conductive tiers in the memory blocks. A through-array-via (TAV) region comprises TAV constructions that extend through the insulative tiers and the conductive tiers. The TAV constructions individually comprise a radially-outer insulative lining and a conductive core radially-inward of the insulative lining. The insulative lining comprises a radially-inner insulative material extending elevationally along the insulative tiers and the conductive tiers and comprises a radially-outer insulative material. The radially-inner insulative material and the radially-outer insulative material are of different compositions relative one another.

In some embodiments, a memory array comprising strings of memory cells comprises laterally-spaced memory blocks individually comprising a vertical stack comprising alternating insulative tiers and conductive tiers. Strings of memory cells comprise channel-material strings that extend through the insulative tiers and the conductive tiers in the memory blocks. A through-array-via (TAV) region comprises TAV constructions that extend through the insulative tiers and the conductive tiers. The TAV constructions individually comprise a radially-outer insulative lining and a conductive core radially-inward of the insulative lining. The insulative lining comprises a radially-inner insulative material extending elevationally along the insulative tiers and the conductive tiers and comprises a radially-outer insulative material extending elevationally along the insulative tiers and the conductive tiers. The radially-inner insulative material and the radially-outer insulative material are of different compositions relative one another. The radially-outer insulative material lining radially-outer recesses that are in the first tiers as compared to the second tiers. The radially-inner insulative material is in individual of the recesses vertically-between upper and lower portions of the radially-outer insulative material that are in the individual recesses.

In some embodiments, a memory array comprising strings of memory cells comprises laterally-spaced memory blocks individually comprising a vertical stack comprising alternating insulative tiers and conductive tiers. Strings of memory cells comprise channel-material strings that extend through the insulative tiers and the conductive tiers in the memory blocks. A through-array-via (TAV) region comprises TAV constructions that extend through the insulative tiers and the conductive tiers. The TAV constructions individually comprise a radially-outer insulative lining and a conductive core radially-inward of the insulative lining. The insulative lining comprises a radially-inner insulative material and a radially-outer insulative material that are of different compositions relative one another. The radially-outer insulative material is in radially-outer recesses that are in the first tiers as compared to the second tiers. The radially-inner insulative material extends elevationally along the insulative tiers and the conductive tiers.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array comprising strings of memory cells, comprising:
    forming a stack comprising vertically-alternating first tiers and second tiers, the stack comprising laterally-spaced memory-block regions and a through-array-via (TAV) region, the stack comprising channel-material strings extending through the first tiers and the second tiers in the memory-block regions, the stack comprising TAV openings in the TAV region;
    forming a radially-outer insulative lining in individual of the TAV openings, the radially-outer insulative lining comprising a radially-inner insulative material extending elevationally along the first tiers and the second tiers and comprising a radially-outer insulative material, the radially-inner insulative material and the radially-outer insulative material being of different compositions relative one another;
    forming a conductive core in the individual TAV openings elevationally along the vertically-alternating first tiers and second tiers radially-inward of the insulative lining to form a TAV in the individual TAV openings;
    the radially-inner insulative material and the radially-outer insulative material at least predominantly comprise $SiO_2$, the radially-inner insulative material comprises a dopant; and
    the radially-outer insulative material has less, if any, of the dopant than the radially-inner insulative material, the dopant comprising at least one of boron, nitrogen, gallium, and metal material.

2. The method of claim 1 wherein total dopant concentration in the radially-inner insulative material is $1 \times 10^{-9}$ atomic percent to 30 atomic percent.

3. The method of claim 2 wherein total dopant concentration in the radially-inner insulative material is 0.1 atomic percent to 10 atomic percent.

4. The method of claim 1 wherein the dopant comprises boron.

5. The method of claim 1 wherein the dopant comprises nitrogen.

6. The method of claim 1 wherein the dopant comprises gallium.

7. The method of claim 1 wherein the dopant comprises metal material.

8. A method used in forming a memory array comprising strings of memory cells, comprising:
    forming a stack comprising vertically-alternating first tiers and second tiers, the stack comprising laterally-spaced memory-block regions and a through-array-via (TAV) region, the stack comprising channel-material strings extending through the first tiers and the second tiers in the memory-block regions, the stack comprising TAV openings in the TAV region;
    forming a radially-outer insulative lining in individual of the TAV openings, the radially-outer insulative lining comprising a radially-inner insulative material extending elevationally along the first tiers and the second tiers and comprising a radially-outer insulative material, the radially-inner insulative material and the radially-outer insulative material being of different compositions relative one another;
    forming a conductive core in the individual TAV openings elevationally along the vertically-alternating first tiers and second tiers radially-inward of the insulative lining to form a TAV in the individual TAV openings;

the forming of the insulative lining sequentially comprising:

forming the radially-outer insulative material; and treating a radially-inner portion of the radially-outer insulative material to change its composition and thereby form the radially-inner insulative material.

9. The method of claim 8 wherein the treating is by at least one of ion implantation and diffusion doping with a dopant.

10. The method of claim 9 wherein, the radially-inner insulative material and the radially-outer insulative material at least predominantly comprise $SiO_2$, the radially-inner insulative material comprises the dopant; and the radially-outer insulative material has less, if any, of the dopant than the radially-inner insulative material, the dopant comprising at least one of carbon, boron, nitrogen, gallium, and metal material.

11. The method of claim 10 wherein the dopant comprises boron.

12. The method of claim 10 wherein the dopant comprises nitrogen.

13. The method of claim 10 wherein the dopant comprises gallium.

14. The method of claim 10 wherein the dopant comprises metal material.

* * * * *